United States Patent
Kang et al.

(10) Patent No.: US 8,558,260 B2
(45) Date of Patent: Oct. 15, 2013

(54) LIGHT EMITTING DEVICE

(75) Inventors: Bong Cheol Kang, Seoul (KR); Hyun Kyong Cho, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 423 days.

(21) Appl. No.: 12/522,246

(22) PCT Filed: Jan. 15, 2009

(86) PCT No.: PCT/KR2009/000222
§ 371 (c)(1),
(2), (4) Date: Jul. 6, 2009

(87) PCT Pub. No.: WO2009/091194
PCT Pub. Date: Jul. 23, 2009

(65) Prior Publication Data
US 2011/0303934 A1    Dec. 15, 2011

(30) Foreign Application Priority Data

Jan. 16, 2008   (KR) .................. 10-2008-0005102

(51) Int. Cl.
*H01L 33/00*      (2010.01)
(52) U.S. Cl.
USPC ................. 257/98; 257/99; 257/100

(58) Field of Classification Search
USPC ..................................... 257/98–100
See application file for complete search history.

(56) References Cited

U.S. PATENT DOCUMENTS

| | | | |
|---|---|---|---|
| 7,087,933 B2 * | 8/2006 | Takeda et al. | 257/94 |
| 7,675,077 B2 * | 3/2010 | Shei et al. | 257/97 |
| 2006/0102933 A1 | 5/2006 | Yamamoto | |
| 2006/0103794 A1 * | 5/2006 | Iijima et al. | 349/114 |
| 2006/0267026 A1 | 11/2006 | Kim et al. | |
| 2010/0308366 A1 | 12/2010 | Kang et al. | |

FOREIGN PATENT DOCUMENTS

| | | |
|---|---|---|
| JP | 2005-197296 A | 7/2005 |
| JP | 2006-135026 A | 5/2006 |
| KR | 10-2005-0096582 A | 10/2005 |
| KR | 10-0635157 B1 | 10/2006 |
| KR | 10-2006-0124510 A | 12/2006 |

* cited by examiner

*Primary Examiner* — Samuel Gebremariam
(74) *Attorney, Agent, or Firm* — Birch, Stewart, Kolasch & Birch, LLP

(57) ABSTRACT

Disclosed is a light emitting device. The light emitting device comprises a reflective layer comprising an alloy of at least one of an Ag-based alloy, an Al-based alloy, Ag, Al, Rh, or Sn, and at least one of Pd, Cu, C, Sn, In or Cr, and a light emitting semiconductor layer comprising a second conductive semiconductor layer, an active layer and a first conductive semiconductor layer on the reflective layer.

18 Claims, 3 Drawing Sheets

LIGHT EMITTING DEVICE

TECHNICAL FIELD

The present disclosure relates to a light emitting device (LED).

BACKGROUND ART

An LED is a semiconductor light emitting device that converts electric current into light.

A wavelength of light emitted from such an LED varies depending on semiconductor material used for the LED. This is because the wavelength of emitted light varies depending on a band gap of the semiconductor materials, which represents difference in energy between valence band electrons and conduction band electrons.

Recently, the brightness of LED has been increased so that the LED is used as a light source for a display apparatus, an illumination device, and a light source for a vehicle. In addition, the LED can emit white light having superior efficiency by using fluorescent material or by combining LEDs having various colors.

DISCLOSURE

Technical Problem

The embodiment provides an LED having improved light efficiency.

The embodiment provides an LED having reduced resistance.

Technical Solution

A light emitting device according to an embodiment comprises a reflective layer comprising an alloy of at least one of an Ag-based alloy, an Al-based alloy, Ag, Al, Rh, or Sn, and at least one of Pd, Cu, C, Sn, In or Cr, and a light emitting semiconductor layer comprising a second conductive semiconductor layer, an active layer and a first conductive semiconductor layer on the reflective layer.

A light emitting device according to an embodiment comprises an anti-oxidation layer comprising at least one of Au, Pt, Rh, TCO or TCN, a reflective layer on the anti-oxidation layer, the reflective layer comprising an alloy of at least one of an Ag-based alloy, an Al-based alloy, Ag, Al, Rh, or Sn, and at least one of Pd, Cu, C, Sn, In or Cr, and a light emitting semiconductor layer on the reflective layer.

A light emitting device according to an embodiment comprises an anti-oxidation layer, a reflective layer on the anti-oxidation layer, the reflective layer comprising an Ag—Pd—Cu alloy containing at least Ag, Pd and Cu, and a light emitting semiconductor layer on the reflective layer.

Advantageous Effects

The embodiment can provide an LED having improved light efficiency.

The embodiment can provide an LED having reduced resistance.

MODE FOR INVENTION

Figure 1:
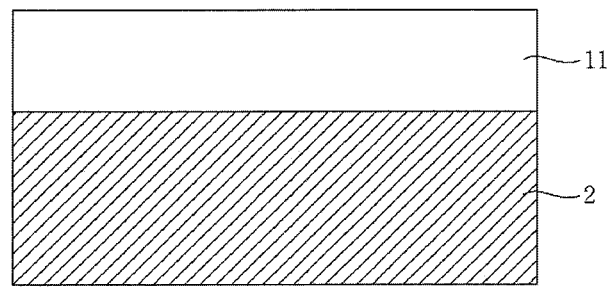
FIG. 1 is a sectional view illustrating a reflective structure of an LED according to a first embodiment.

Hereinafter, embodiments will be described in detail with reference to the accompanying drawings.

The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art.

The same reference numerals are used to designate the same elements throughout the drawings. In the drawings, the sizes and relative sizes of layers and regions may be exaggerated for clarity.

It will be understood that when an element such as a layer, a region or a substrate is referred to as being "on" or "under" another element, it can be directly on or under the other element or intervening elements may be present. When a part of an element such as a surface is referred to as a term "inner", it will be understood that the part is far away from a device as compared with other parts of the element.

It will be understood that such terms include other directions of the device in addition to the directions shown in the drawings. Last, when an element is referred to as being "directly on" another element, there are no intervening elements present. As used herein, the term "and/or" includes any and all combinations of one or more of the associated listed items.

It will be understood that terms "the first" and "the second" may be used for describing various elements, components, areas, layers and/or regions, but such elements, components, areas, layers and/or regions should not be construed as limited to such terms.

FIG. 1 is a sectional view illustrating a reflective structure of an LED according to a first embodiment.

Referring to FIG. 1, a reflective layer 11 is formed on a light emitting semiconductor layer 2.

The light emitting semiconductor layer 2 includes a first conductive semiconductor layer, an active layer and a second semiconductor layer. For example, the first conductive semiconductor layer may include a nitride semiconductor layer doped with n-type impurities, the second conductive semiconductor layer may include a nitride semiconductor layer doped with p-type impurities, and the active layer is interposed between the first and second conductive semiconductor layers.

The reflective layer 11 improves light efficiency by reflecting light emitted from the light emitting semiconductor layer 2, and serves as an ohmic contact.

The reflective layer 11 includes an alloy containing reflective electrode material and material that suppresses grain boundary diffusion.

In polycrystalline thin films, diffusion of atoms occurs along a grain boundary in the range of the temperature lower than about (0.5×Tm) (Tm denotes a melting point). Such grain boundary diffusion is accelerated by the temperature and electric field, causing agglomeration and electromigration.

In the LED according to the embodiment, the reflective layer 11 includes the alloy containing reflective electrode material and a small amount of the material that suppresses the grain boundary diffusion.

In detail, the reflective layer 11 may include at least one of an Ag-based alloy, an Al-based alloy, Ag, Al, Rh, or Sn as the reflective electrode material, and may include at least one of Pd, Cu, C, Sn, In or Cr as the material that suppresses the grain boundary diffusion.

Further, about 3 weight % or less of the material that suppresses the grain boundary diffusion may be included in the reflective layer 11. For example, in the case of Pd, about 0.1 weight % to about 5 weight % of the Pd may be included in the reflective layer 11. In the case of Cu, about 0.1 weight % to about 10 weight % of the Cu may be included in the reflective layer 11.

Further, the material that suppresses the grain boundary diffusion is precipitated at a grain boundary during a heat treatment process to enhance mechanical strength of the reflective layer 11.

Further, the reflective layer 11 may include at least one of Ni, Au, Pt, Pd, Ti, W, Ir, Ru, Ta, V, Vo, Os, Re or Rh capable of forming an ohmic contact with the light emitting semiconductor layer 2. The reflective layer 11 can be provided as a single layer capable of simultaneously serving as an ohmic contact layer and a reflective electrode.

For example, when the light emitting semiconductor layer 2 is provided as a GaN-based semiconductor layer, the reflective layer 11 may be provided as an AG-Pd—Cu alloy containing at least Ag, Pd and Cu on a nitride semiconductor layer doped with p-type impurities.

Although the AG-Pd—Cu alloy is subject to a heat treatment process at the temperature of about 400° C. to about 600° C., the agglomeration does not occur. Further, the AG-Pd—Cu alloy forms an ohmic contact with the nitride semiconductor layer doped with the p-type impurities. For example, when the reflective layer 11 contains only silver (Ag), if the reflective layer 11 is subject to the heat treatment process at the temperature of about 400° C., the agglomeration occurs, in which a grain size of the silver (Ag) is increased and small hillock is formed. However, the agglomeration does not occur in the AG-Pd—Cu alloy.

According to the experiment, when the reflective layer 11 containing the AG-Pd—Cu alloy has a thickness of about 100 nm or more, operating voltage is about 3.06V at a size of about 375×330 μm$^2$ and about 20 mA.

The LED according to the experiment does not separately include an ohmic contact layer, so light can be prevented from being absorbed in the ohmic contact layer. Thus, reflectivity is increased and light efficiency is improved.

According to the experiment, when the reflective layer 11 containing the AG-Pd—Cu alloy has reflectivity of about 90% or more at a blue wavelength of about 450 nm.

Figure 2:
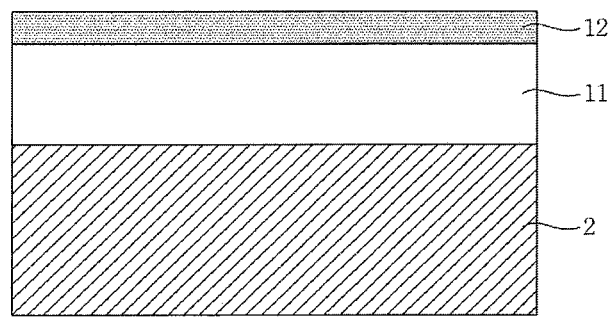
FIG. 2 is a sectional view illustrating a reflective structure of an LED according to a second embodiment.

FIG. 2 is a sectional view illustrating a reflective structure of an LED according to a second embodiment. In the description about the reflective structure of the LED according to the second embodiment, description about elements similar to or identical to those of the reflective structure of the previous embodiment will be omitted.

Referring to FIG. 2, in the LED according to the second embodiment, the reflective structure includes a reflective layer 11 on a light emitting semiconductor layer 2, and an anti-oxidation layer 12 on the reflective layer 11.

The anti-oxidation layer 12 prevents an oxide layer from being formed on a surface of the reflective layer 11 due to oxidation of metal material, such as Ag, Al and Ni, contained in the reflective layer 11 during a heat treatment process, so that resistance of the reflective layer 11 can be reduced.

The anti-oxidation layer 12 may include at least one of Au, Pt, Rh, transparent conductive oxide (TCO) or transparent conductive nitride (TCN). For example, the TCO may include indium tin oxide (ITO).

The anti-oxidation layer 12 may include material, which rarely causes interdiffusion with the reflective layer 11 during the heat treatment process, to prevent reflectivity of the reflective layer 11 from being reduced. Further, the anti-oxidation layer 12 may include material having low solubility.

Although not shown in FIG. 2, when adhesive force is reduced between the anti-oxidation layer 12 and the reflective layer 11, an adhesive layer may be interposed therebetween.

According to the experiment, when manufacturing the LED by forming the reflective layer 11 containing an AG-Pd—Cu alloy and having a thickness of about 150 nm on a nitride semiconductor layer doped with p-type impurities, and forming the anti-oxidation layer 12 containing the ITO and having a thickness of about 10 nm on the reflective layer 11, operating voltage is about 3.08V at a size of about 375×330 μm$^2$ and about 20 mA.

Figure 3:
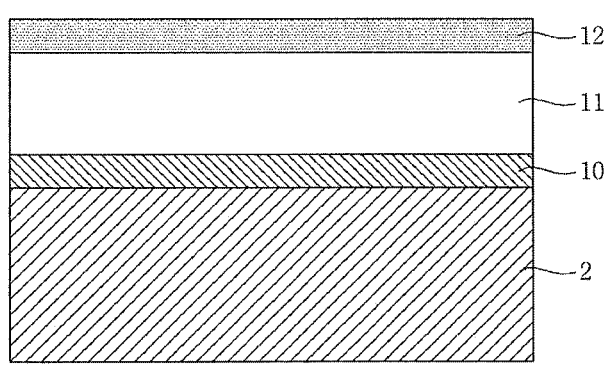
FIG. 3 is a sectional view illustrating a reflective structure of an LED according to a third embodiment.

FIG. 3 is a sectional view illustrating a reflective structure of an LED according to a third embodiment. In the description about the reflective structure of the LED according to the third embodiment, description about elements similar to or identical to those of the reflective structure of the previous embodiments will be omitted.

Referring to FIG. 3, the reflective structure of the LED according to the third embodiment includes an anti-diffusion layer 10 interposed between a light emitting semiconductor layer 2 and a reflective layer 11. Further, the reflective structure includes an anti-oxidation layer 12 on the reflective layer 11.

The anti-diffusion layer 10 prevents a part of material included in the reflective layer 11 from being diffused into the light emitting semiconductor layer 2. The anti-diffusion layer 10 includes material capable of forming an ohmic contact with the light emitting semiconductor layer 2, and is thinly formed to prevent reduction in reflectivity.

The anti-diffusion layer 10 may include at least one of TCO, TCN, Ni, Pt, Pd, W, Ru or Ir.

According to the experiment, when manufacturing the LED by forming the reflective layer 11 containing an AG-Pd—Cu alloy and having a thickness of about 150 nm on a nitride semiconductor layer doped with p-type impurities, interposing the anti-diffusion layer 10 containing the ITO and having a thickness of about 10 nm between the nitride semiconductor layer and the reflective layer 11, and forming the anti-oxidation layer 12 containing the ITO and having a thickness of about 10 nm on the reflective layer 11, operating voltage is about 3.22V at a size of about 375×330 μm$^2$ and about 20 mA.

Figure 4:
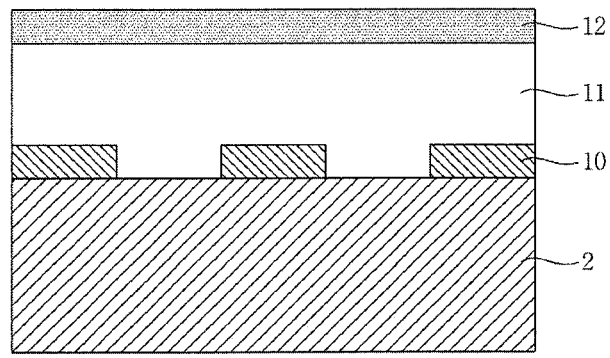
FIG. 4 is a sectional view illustrating a reflective structure of an LED according to a fourth embodiment.

FIG. 4 is a sectional view illustrating a reflective structure of an LED according to a fourth embodiment. In the description about the reflective structure of the LED according to the fourth embodiment, description about elements similar to or identical to those of the reflective structure of the previous embodiments will be omitted.

Referring to FIG. 4, the reflective structure of the LED according to the fourth embodiment includes an anti-diffusion layer 10 partially formed on a light emitting semiconductor layer 2. The anti-diffusion layer 10 may also be a discontinuous layer.

As the anti-diffusion layer 10 is partially formed on the light emitting semiconductor layer 2, the light emitting semiconductor layer 2 partially makes direct contact with the anti-diffusion layer 10. Thus, since the light emitting semiconductor layer 2 and the anti-diffusion layer 10 form a direct ohmic contact, the anti-diffusion layer 10 may include material, which does not form the ohmic contact.

Figure 5:
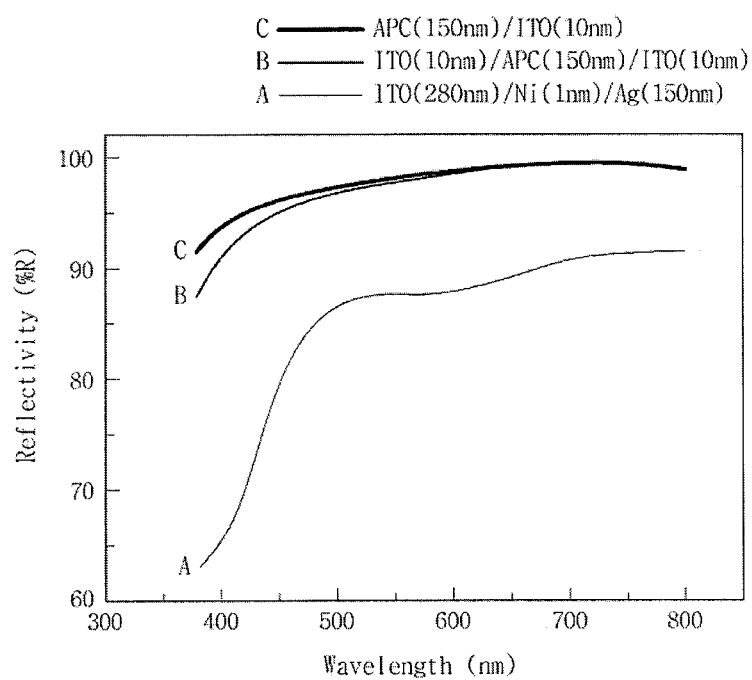
FIG. 5 is a graph illustrating reflectivity within the range of a visible ray of reflective structures of LEDs according to embodiments and reflectivity within the range of a visible ray of a reflective structure of a conventional LED.

FIG. 5 is a graph illustrating reflectivity within the range of a visible ray of the reflective structures of the LEDs according to the embodiments and reflectivity within the range of a visible ray of a reflective structure of a conventional LED.

Referring to FIG. 5, graph "A" represents the reflectivity within the range of the visible ray of the reflective structure of the conventional LED, in which an ITO layer having a thickness of about 280 nm is formed on a light emitting semiconductor layer, an Ni layer having a thickness of about 1 nm is formed on the ITO layer, and an Ag layer having a thickness of about 150 nm is formed on the Ni layer. Graph "B" represents the reflectivity within the range of the visible ray of the reflective structure of the LED as described in the third embodiment, in which the ITO layer having a thickness of about 10 nm is formed on the light emitting semiconductor layer 2 as the anti-diffusion layer 10, the APC layer (Ag—Pd—Cu alloy layer) having a thickness of about 150 nm is formed on the anti-diffusion layer 10 as the reflective layer 11, and the ITO layer having a thickness of about 10 nm is formed on the reflective layer 11 as the anti-oxidation layer 12. Graph "C" represents the reflectivity within the range of the visible ray of the reflective structure of the LED as described in the second embodiment, in which the APC layer (Ag—Pd—Cu alloy layer) having a thickness of about 150 nm is formed on the light emitting semiconductor layer 2 as the reflective layer 11, and the ITO layer having a thickness of about 10 nm is formed on the reflective layer 11 as the anti-oxidation layer 12.

As shown in FIG. 5, the reflective structures as described in the second and third embodiments have improved reflectivity as compared with that of the conventional reflective structure. In particular, the reflective structures as described in the second and third embodiments have the reflectivity improved by about 15% at a wavelength of about 450 nm, as compared with that of the conventional reflective structure.

Figure 6:
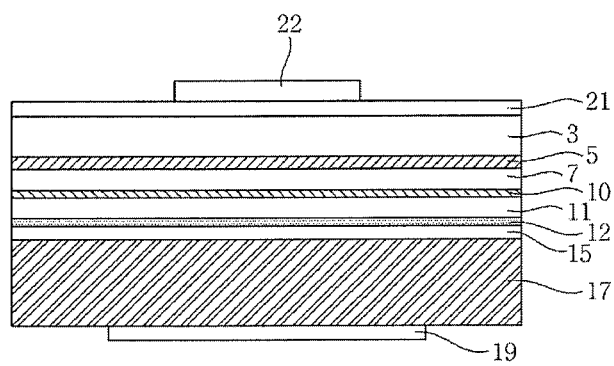
FIG. 6 is a sectional view illustrating an LED having a reflective structure according to an embodiment.

FIG. 6 is a sectional view illustrating the LED having the reflective structures according to the embodiments.

Referring to FIG. 6, in the LED having the reflective structures according to the embodiments, a second conductive semiconductor layer 7, an active layer 5 and a first conductive semiconductor layer 3 are sequentially laminated on a conductive holder 17.

The reflective layer 11 can be formed between the conductive holder 17 and the second conductive semiconductor layer 7. Further, the anti-diffusion layer 10 can be formed between the reflective layer 11 and the second conductive semiconductor layer 7, and the anti-oxidation layer 12 can be formed between the reflective layer 11 and the conductive holder 17. The anti-diffusion layer 10 may be partially formed as described in the fourth embodiment.

Further, a seed layer 15 or an adhesive layer may be formed between the conductive holder 17 and the anti-oxidation layer 12 to form the conductive holder 17.

A first electrode layer 19 can be laminated under the conductive holder 17, and a second electrode layer 21 and an electrode pad 22 can be sequentially laminated on the first conductive semiconductor layer 3.

Thus, light emitted from the active layer 5 and irradiated into the semiconductor layers is reflected by the reflective layer 11 and emitted upward from the LED, so that the light emitting efficiency of the LED can be improved.

FIG. 6 shows the LED having a vertical structure in which the first and second electrode layers 19 and 21 are vertically disposed. However, the reflective structures can be applied to various LEDs such as a LED having a horizontal structure.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

INDUSTRIAL APPLICABILITY

The LED according to the embodiments can be used as a light source for an illumination apparatus and an electronic appliance.

The invention claimed is:

1. A light emitting device comprising:
   a reflective layer comprising an alloy of at least one of an Ag-based alloy, an Al-based alloy, Ag, Al, Rh, or Sn, and at least one of Pd, Cu, C, Sn, In or Cr;
   a light emitting semiconductor layer comprising a second conductive semiconductor layer, an active layer and a first conductive semiconductor layer on the reflective layer; and
   an anti-diffusion layer between the reflective layer and the light emitting semiconductor layer,
   wherein the light emitting semiconductor layer physically contacts the reflective layer and the anti-diffusion layer,
   wherein the anti-diffusion layer comprises a plurality of portions spaced apart from each other, and
   wherein the reflective layer is disposed between adjacent portions of the anti-diffusion layer.

2. The light emitting device as claimed in claim 1, wherein the reflective layer includes at least one of Ni, Au, Pt, Ti, W, Ir, Ru, Ta, V, Vo, Os or Re.

3. The light emitting device as claimed in claim 1, comprising a conductive holder under the reflective layer.

4. The light emitting device as claimed in claim 3, comprising an anti-oxidation layer between the reflective layer and the conductive holder.

5. The light emitting device as claimed in claim 4, wherein the anti-oxidation layer includes at least one of Au, Pt, Rh, TCO or TCN.

6. The light emitting device as claimed in claim 1, wherein the anti-diffusion layer includes at least one of transparent conductive oxide (TCO), transparent conductive nitride (TCN), Ni, Pt, Pd, W, Ru or Ir.

7. The light emitting device as claimed in claim 1, wherein the anti-diffusion layer is partially formed between the reflective layer and the light emitting semiconductor layer.

8. The light emitting device as claimed in claim 1, wherein the reflective layer contacts the light emitting semiconductor layer between the adjacent portions.

9. The light emitting device as claimed in claim 1, wherein the reflective layer has a top surface comprising a plurality of recess portions configured to contact the anti-diffusion layer and a plurality of protrusion regions between the recess portions and configured to contact the light emitting semiconductor layer.

10. A light emitting device comprising:
an anti-oxidation layer comprising at least one of Au, Pt, Rh, TCO or TCN;
a reflective layer on the anti-oxidation layer, the reflective layer comprising an alloy of at least one of an Ag-based alloy, an Al-based alloy, Ag, Al, Rh, or Sn, and at least one of Pd, Cu, C, Sn, In or Cr;
a light emitting semiconductor layer on the reflective layer; and
an anti-diffusion layer between the reflective layer and the light emitting semiconductor layer,
wherein the light emitting semiconductor layer physically contacts the reflective layer and the anti-diffusion layer,
wherein the anti-diffusion layer comprises a plurality of portions spaced apart from each other, and
wherein the reflective layer is disposed between adjacent portions of the anti-diffusion layer.

11. The light emitting device as claimed in claim 10, wherein the anti-diffusion layer comprises at least one material of TCO, TCN, Ni, Pt, Pd, W, Ru or Ir.

12. The light emitting device as claimed in claim 10, further comprising an adhesive layer between the anti-oxidation layer and the reflective layer.

13. The light emitting device as claimed in claim 10, wherein the reflective layer contacts the light emitting semiconductor layer between the adjacent portions.

14. A light emitting device comprising:
an anti-oxidation layer;
a reflective layer on the anti-oxidation layer, the reflective layer comprising an Ag—Pd—Cu alloy containing at least Ag, Pd and Cu;
a light emitting semiconductor layer on the reflective layer; and
an anti-diffusion layer between the reflective layer and the light emitting semiconductor layer,
wherein the light emitting semiconductor layer physically contacts the reflective layer and the anti-diffusion layer,
wherein the anti-diffusion layer comprises a plurality of portions spaced apart from each other, and
wherein the reflective layer is disposed between adjacent portions of the anti-diffusion layer.

15. The light emitting device as claimed in claim 14, wherein the anti-oxidation layer comprises at least one of Au, Pt, Rh, TCO or TCN.

16. The light emitting device as claimed in claim 14, comprising:
a seed layer or an adhesive layer under the anti-oxidation layer; and
a conductive holder under the seed layer or the adhesive layer.

17. The light emitting device as claimed in claim 14, wherein the Ag—Pd—Cu alloy has a thickness of about 150 nm.

18. The light emitting device as claimed in claim 14, wherein the reflective layer contacts the light emitting semiconductor layer between the adjacent portions.

* * * * *